United States Patent
Pan et al.

(10) Patent No.: US 7,583,772 B2
(45) Date of Patent: Sep. 1, 2009

(54) SYSTEM FOR SHIFTING DATA BITS MULTIPLE TIMES PER CLOCK CYCLE

(75) Inventors: Hui Pan, Irvine, CA (US); Seong-Ho Lee, Aliso Viejo, CA (US); Michael Q. Le, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 686 days.

(21) Appl. No.: 11/240,678

(22) Filed: Oct. 3, 2005

(65) Prior Publication Data

US 2006/0188030 A1    Aug. 24, 2006

Related U.S. Application Data

(60) Provisional application No. 60/655,086, filed on Feb. 22, 2005.

(51) Int. Cl.
*H04L 7/00* (2006.01)

(52) U.S. Cl. .............. 375/372; 375/371; 375/259; 375/354; 375/355

(58) Field of Classification Search .......... 375/259, 375/372, 371
See application file for complete search history.

(56) References Cited

U.S. PATENT DOCUMENTS

| 5,901,179 | A | * | 5/1999 | Urabe et al. | 375/259 |
|---|---|---|---|---|---|
| 6,094,450 | A | * | 7/2000 | Shockey | 375/141 |
| 6,484,268 | B2 | * | 11/2002 | Tamura et al. | 713/600 |
| 6,930,932 | B2 | * | 8/2005 | Rentschler | 365/193 |
| 7,047,384 | B2 | * | 5/2006 | Bodas et al. | 711/167 |
| 7,349,510 | B2 | * | 3/2008 | Best et al. | 375/355 |
| 2003/0035496 | A1 | * | 2/2003 | Noda | 375/308 |
| 2004/0208048 | A1 | * | 10/2004 | Doi et al. | 365/145 |
| 2004/0208270 | A1 | * | 10/2004 | Schmatz et al. | 375/355 |
| 2004/0218705 | A1 | * | 11/2004 | Cranford et al. | 375/355 |
| 2005/0078021 | A1 | * | 4/2005 | Cohen et al. | 341/68 |

\* cited by examiner

*Primary Examiner*—Shuwang Liu
*Assistant Examiner*—Kenneth Lam
(74) *Attorney, Agent, or Firm*—Sterne, Kessler, Goldstein & Fox P.L.L.C.

(57) ABSTRACT

A system and method are used to allow for phase rotator control signals to be produced that rotate bits in the signals more than one step per clock cycle. This can be done through the following operation. First and second data signals that include a plurality of data bits are stored. Rotation of data bits in the first data signal and subsequently data bits in the second data signal is controlled based on a phase control signal during each clock cycle. The first and second controlled data signals are interleaved to form first and second interleaved data signals. One of the first and second interleaved data signals is selected based on a portion of the phase control signal during a second half of the clock cycle. Finally, the selected data signal is transmitted as the phase control signal.

13 Claims, 6 Drawing Sheets

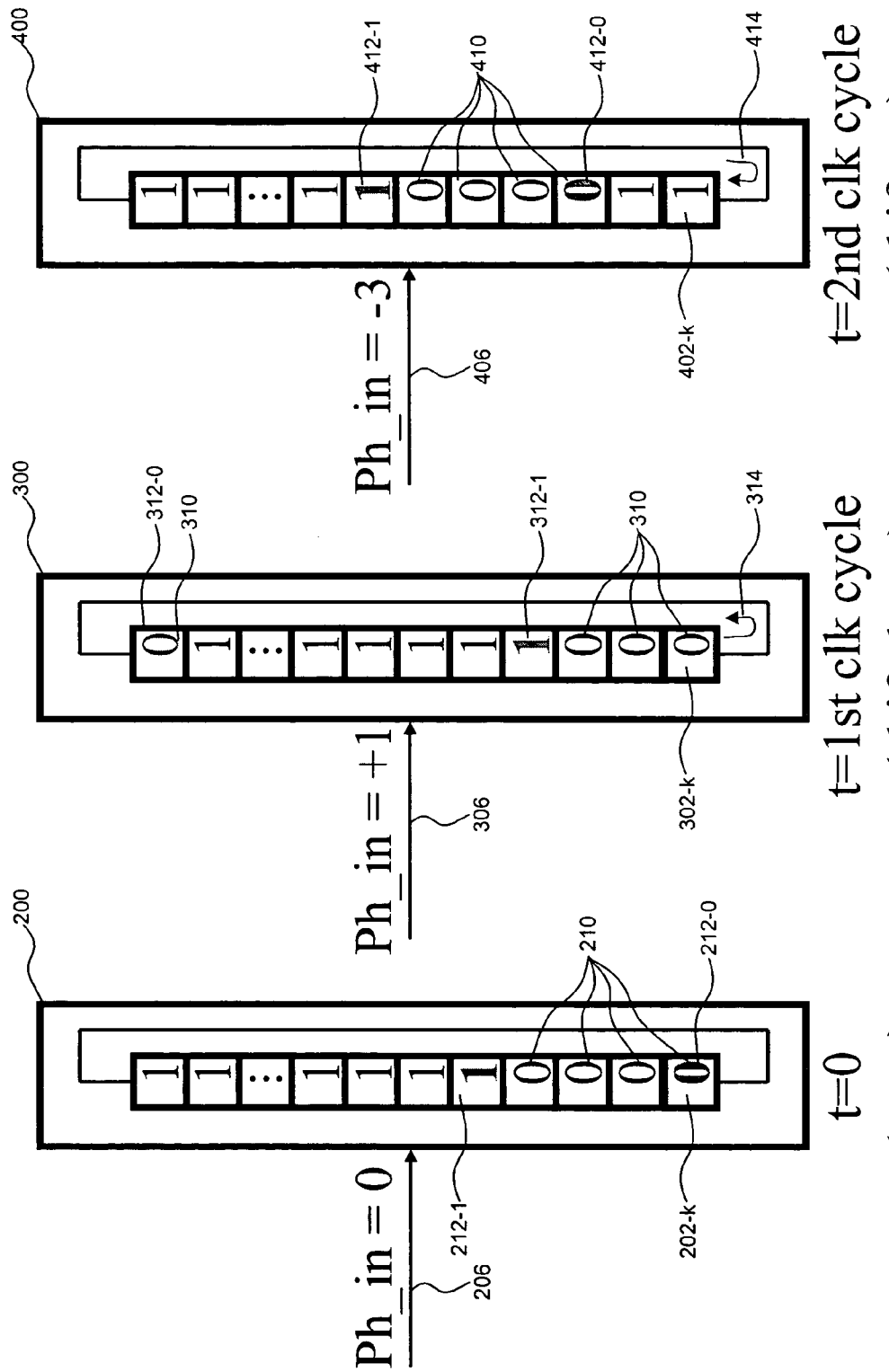

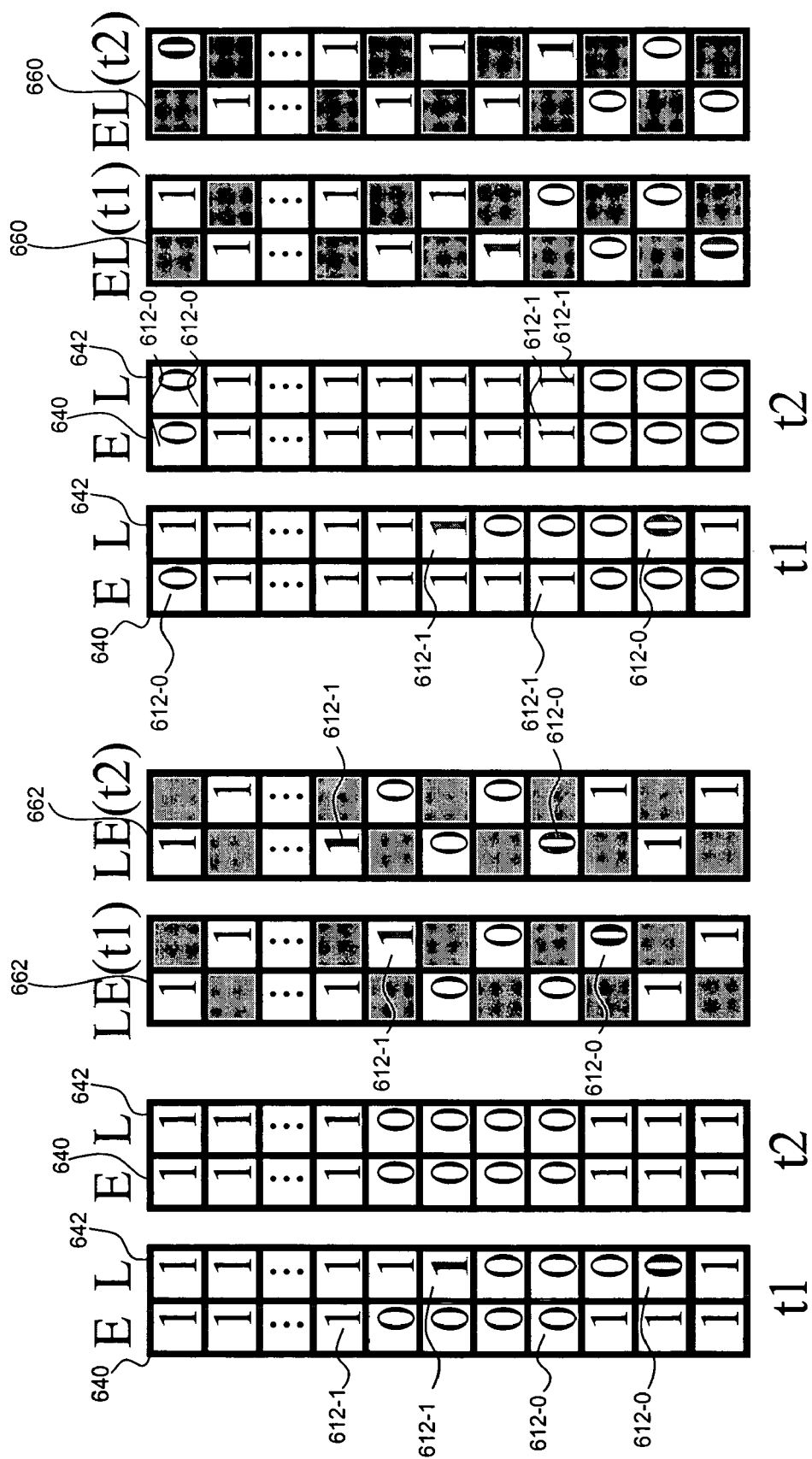

SYSTEM FOR SHIFTING DATA BITS MULTIPLE TIMES PER CLOCK CYCLE

CROSS REFERENCE TO RELATED APPLICATIONS

This application claims benefit under 35 U.S.C. §119(e) to U.S. Provisional Patent Application No. 60/665,086, filed Mar. 25, 2005, which is incorporated by reference herein in its entirety.

BACKGROUND

1. Field

The present invention relates to phase rotators.

2. Related Art

Presently, a shifting device (e.g., cyclic encoder) is used to adjust bit position in a storage device based on a received phase signal. The shifted bits are then used to form phase control signals for subsequent devices, such as phase rotators. However, when an input phase signal requires more than one bit shift per clock cycle, i.e., rotation step is more than one bit, because the shifting device can only shift once per clock cycle, the phase rotator output characteristics, e.g., phase resolution or phase error, may be degraded.

Therefore, what is needed is a system and method to maintain the desirable phase rotator output characteristics by shifting bits multiple times per clock period.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 2 shows bit positions of bits in a cyclic encoder at a first time period.

FIG. 3 shows bit positions of bits in a cyclic encoder at a second time period.

FIG. 4 shows bit positions of bits in a cyclic encoder at a third time period.

FIG. 7 shows first and second registers and a second interleaved signal during first and second time periods, according to a first exemplary operation of the system shown in FIG. 6.

FIG. 8 shows first and second registers and a first interleaved signal during first and second time periods, according to a second exemplary operation of the system shown in FIG. 6.

Figure 1:
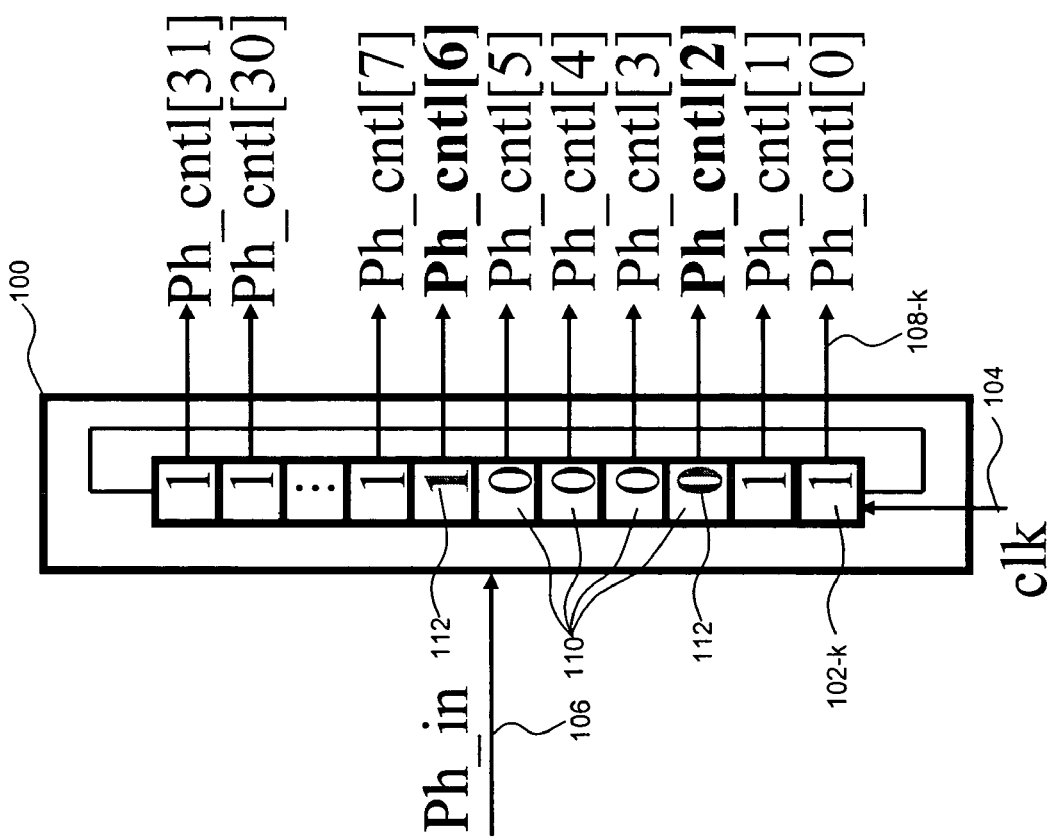
FIG. 1 shows an exemplary cyclic encoder.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provides a system and method that are used to allow for phase rotator control signals to be produced that rotate bits in the signals more than one step per clock cycle. This can be done through the following operation. First and second data signals that include a plurality of data bits are stored. Rotation of data bits in the first data signal and subsequently data bits in the second data signal is controlled based on a phase control signal during each clock cycle. The first and second controlled data signals are interleaved to form first and second interleaved data signals. One of the first and second interleaved data signals is selected based on a portion of the phase control signal during a second half of the clock cycle. Finally, the selected data signal is transmitted as the phase control signal.

FIG. 1 shows an exemplary cyclic encoder 100, for example, that can be used to drive a phase rotator (not shown). Cyclic encoder 100 includes a plurality of memory locations 102, each storing one bit or data bit (e.g., either a 0 or a 1). For reference, a bottom memory location is considered a "0" location and a top memory location is considered an "N−1" location, where N is the total number of storage units (e.g., registers) in the encoder 100. In the example of FIG. 1, N=32. Cyclic encoder 100 receives a clock signal 104 and a phase signal 106 (e.g., Ph_in), and generates a plurality of phase control signals 108-$k$ (e.g., Ph_cntl[k]), where k is an integer from 0 to N−1. Phase signal 106 controls what bit value (0 or 1) is stored in each memory location 102 during a particular time period, as is described in more detail below.

The use of a cyclic code to drive a phase rotator is a common method to realize digital-to-analog (D/A) conversion of phase signals 106, for example. In one example, a cyclic code consists of an EVEN number of identical active bits and another EVEN number of complementary bits, together forming a circle of total $N=2^n$ bits. Again, the example shown in FIG. 1 shows N=32 circular bits (cyclic code) emanating from a cyclic encoder driving an n=5 bit ($N=2^n$) phase rotator (not shown) with the four active bits 110 set to "0", which are in memory locations 102-2 to 102-5. The position of the active bits 110 in the circle carries the phase information of phase signal 106, with each bit shift of the cyclic code corresponding to one LSB=$2*\pi/N$ phase increment in the phase rotator output. In the example shown, there are critical bits 112 (shown as darkened) that are at the transition point between a 0 and a 1, which are bits stored in memory locations 102-2 and 102-6. Critical bits 112 are those that have a complementary neighbor bit immediately below them.

FIG. 2 shows bit positions of bits in a cyclic encoder 200 at a first time period. For example, the first time period can be a reset time period at starting at t=0. In this reset state, the data bits do not move and the bottom four active bits are set to 0 while the phase signal 106 is also set to 0.

FIG. 3 shows bit positions of bits in a cyclic encoder 300 at a second time period. For example, the second time period is during or after a first clock cycle. In this time period, a phase signal 306 represents a +1 phase shift. Thus, the data bits rotate "down" in the direction of arrow 314 one memory location 302 with respect to where they were located during the first time period, as shown in FIG. 2. For example, transition and active bit 312-0 moves from memory location 302-0 to 302-31. Thus, phase control signals (not shown) output to a phase rotator would reflect this phase shift.

FIG. 4 shows bit positions of bits in a cyclic encoder 400 at a third time period. For example, the third time period is during or after a second clock cycle. In this time period, a phase signal 406 represents a −3 phase shift. Thus, data bits rotate "up" in the direction of arrow 414 three memory locations 302 with respect to where they were located during the second time period, as shown in FIG. 3. For example, active and critical bit 312-0 moves from memory location 302-31 to 302-2. Thus, phase control signals (not shown) output to a phase rotator would reflect this phase shift.

In one example, for each clock period the active bits 210 rotate once in either direction, the direction depending on the sign of the input phase signal 206 (Ph_in), by a certain rotation step or number of bit positions. When the phase input magnitude |Ph_in| or the rotation step is more than one bit, this can cause the phase rotator output to experience a multi-LSB (Least Significant Bit) phase jump in one rotation step, which can degrade the phase rotator effective resolution and the output phase error.

In the embodiments discussed below, systems and method are used to maintain the desirable phase resolution of a phase rotator by shifting bits multiple times for each clock period.

Figure 5:
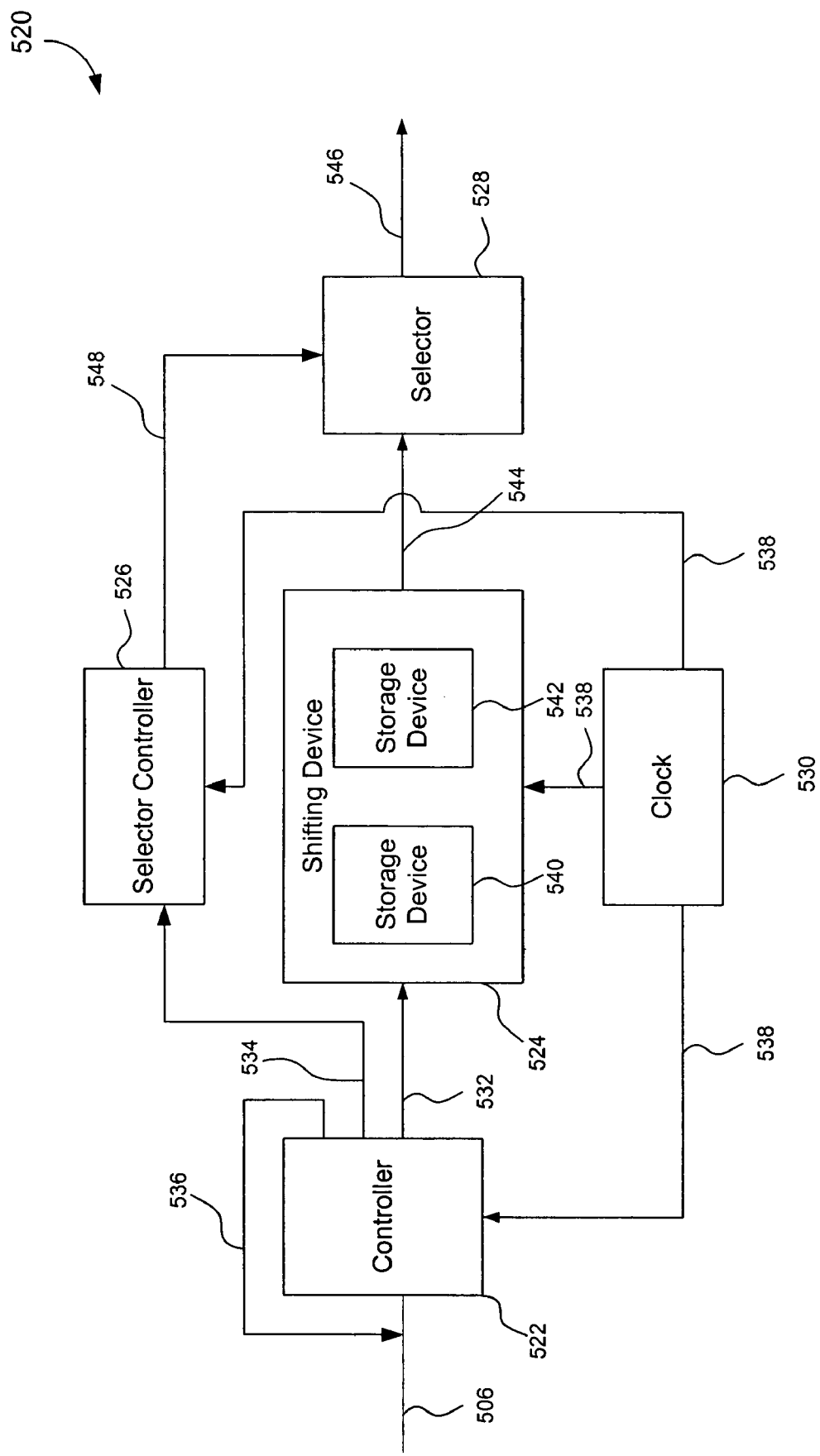
FIG. 5 shows a system, according to one embodiment of the present invention.

FIG. 5 shows a system 520, according to one embodiment of the present invention. System 520 includes a controller 522, a shifting device 524, a selector controller 526, a selector 528, and a clock 530. Each of controller 522, selector controller 526, and shifting device 524 receive a clock signal 538 from clock 530.

In this embodiment, a phase signal 506 is received at controller 522. Controller 522 produces a first signal 532, which is received at shifting device 524, a second signal 534, which is received at selector controller 526, and a feedback signal 536, which is received at an input of controller 522. Each of first, second, and feedback signals 532, 534, and 536 can contain all or a portion of phase signal 506, depending on what the respective receiving devices needs to receive.

Feedback signal 536 is used to inform controller 522 of previous phase signals 506 received to maintain a proper operation of system 520.

Shifting device 524 uses phase signal 532 to control data stored in first and second storage devices 540 and 542, as discussed in more detail below. Once data bits in first and second storage devices 540 and 542 are properly rotated based on second signal 532, a data signal 544 is output to selector 528. Selector 528 selects all or a portion of data signal 544 to output as selected signal 546 based on a selector control signal 548. Selector control signal 548 is generated from processing of second signal 534 in selector controller 526.

Figure 6:
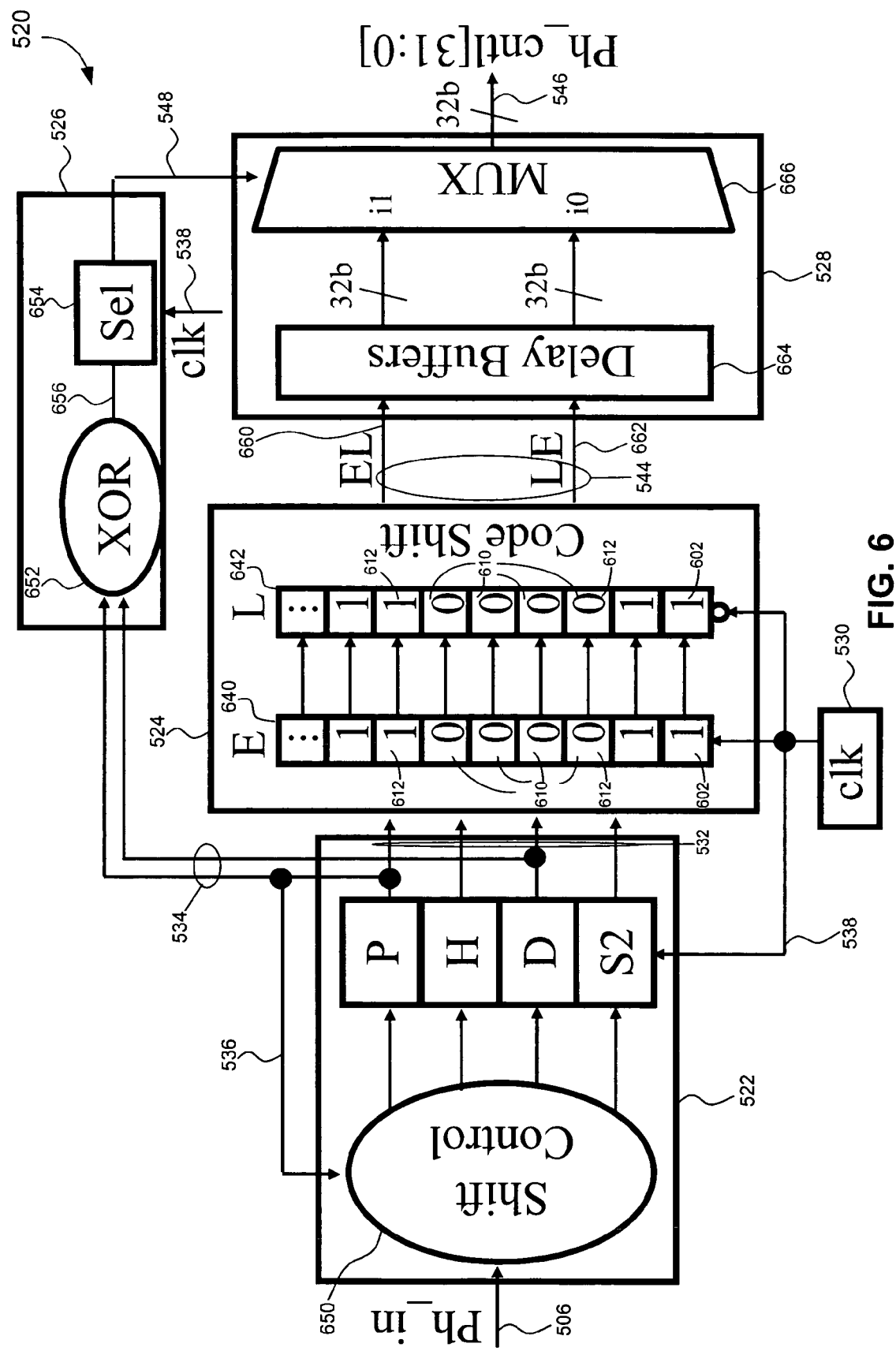
FIG. 6 shows an exemplary implementation of the system of FIG. 5, according to one embodiment of the present invention.

FIG. 6 shows an exemplary implementation of system 520, according to one embodiment of the present invention.

In this embodiment, controller 522 includes a shift control 650 that separates phase signal 506 into four signals or control bits, P, H, D, and S2. For example, the phase input 506 Ph_in assumes values of the set 0, +/−1, +/−2 and is converted into four control bits, D, S2, H and P by shift control 650. In this example, D controls a bit shift direction, with D=1 arbitrarily defined for shift-down and D=0 for shift-up (see FIGS. 3 and 4, which show shifting up and down), S2 determines a shift step size with S2=1 for a 2-bit shift and S2=0 for other step sizes, H determines whether there should be a hold on all shifting with H=1 forcing a hold (no rotation or rotation step), and P keeps track of a parity of the cyclic code position.

In this example, first signal 532 includes all four control bits P, H, D, and S2, second signal 534 includes control bits P and D, and feedback signal 536 includes control bit P.

Shifting device 524 includes first and second storage devices 640 and 642, which are 32-bit registers in this embodiment. In one example, first and second registers 640 and 642 will each individually function similar to storage devices 102, 202, 302, and 402 discussed above. Each register 640 and 642 rotates bits, if phase signal 506 indicates a phase shift is needed, only at the beginning of the respective halves of a clock cycle or at one of a rising or falling edge of the clock cycle. For example, first register 640 can be controlled, if necessary, to rotate bits during a first half of the clock cycle, while second register 642 can be controlled, if necessary, to rotate bits during a second half of a clock cycle. Accordingly, shifter 524 can be referred to as a multiple data bit per clock shifting device.

In one example, a one bit shift-up or shift-down involves flipping the two critical bits 612 or the bits immediately below the two critical bits 612, respectively, while keeping the rest of the bits unchanged.

In one example, at each rising (or falling) edge of clock "clk" or at the start of the first half of each clock cycle t=m*T+d, where T is the clock period, m is an integer and d is an infinitely small delay, the bits in first register 640 (e.g., register E) are rotated under control of first signal 532, which includes control bits P, D, S2, and H. Then, at each falling (or rising) edge or at the beginning of the second half of the clock cycle t=(m+½)*T+d, the bits in register 640 are loaded to register 642, such that L[31:0]=E [31:0].

In one example, before receiving an initial phase control signal 506, both registers 640 (E) and 642 (L) are initially reset, such that four active bits 610 are initially located at a bottom memory location 602 of registers 640 and 642, e.g., as shown in FIG. 2, such that E[3:0]=L[3:0]=0 and P=1.

In this embodiment, shifted signal 544 comprises a first interleaved signal 660 (e.g., EL) and a second interleaved signal 662 (e.g., LE). First and second interleaved signals 660 and 662 include interleaved odd and even bits from first and second registers 640 (E) and 642 (L). For example, first interleaved signal 660 EL[31:0]=L[31], E[30], L[29], E[28], . . . , L[3], E[2], L[1], E [0], which includes odd-index bits from second register 642 L and even-index bits from first register 640 E, and second interleaved signal 662 LE[31:0]=E [31], L[30], E[29], L[28], . . . , E[3], L[2], E[1], L[0], which includes odd-index bits from first register 640 E and even-indexed bits from second register 642 L.

Selector controller 526 comprises a XOR logic device 652 and a selector 654 (e.g., a register). XOR logic device 652 inputs second signal 534, i.e., control bits P and D, and outputs a result signal 656, which is received at selector 654. Selector 654 outputs selection control signal 548, which is used to select which of first or second interleaved signals 660 or 662 is used as selected signal 546.

For example, first and second interleaved signals 660 and 662 are fed to selector 528, which comprises a delay device 664 and a multiplexer 666. delay device 664 is used to delay receipt of first and second interleaved signals 660 and 662 at multiplexer 666 until selector 654 has generated selection control signal 548, which, for example, is done during a second half of a clock cycle. In one example, multiplexer 666 is a 2:1 multiplexer.

In an exemplary operation, XOR device 652 result signal 656 is loaded to selector 654, such that Sel=(D xor P), where Sel is the selector output, determines which of first interleaved signal 660 EL and second interleaved signal LE is multiplexed out as selected signal 546 (Ph_cntl). For example, when D=P, or Sel=0, second interleaved signal 662 LE is selected as signal 546, otherwise first interleaved signal 660 EL is multiplexed out as signal 546.

In one example, parity bit P is arbitrarily set to 1 when the memory locations of the two critical bits 612 are even numbers, i.e., P(even critical bit index)=1. Again, critical bits 612 are those that have a complementary neighbor bit immediately below them, as discussed above with regards to FIG. 1. Spaced by the even number of active bits 610, the critical bits 612 have the same parity.

FIG. 7 shows first and second registers 640 E and 642 L and second interleaved signal 662 LE during first and second time periods t1 and t2 when H=0, P=0, and D=0 (Sel=0), according to a first example operation of system 520 in FIG. 6. In this example, the odd(-indexed) critical bits 612 in first register 640 E are going to shift up by 1 or 2 bits at the beginning of the coming clock cycle.

In the first half of the coming clock cycle t=t1=(d, T/2), second interleaved signal 662 LE experiences a 1-bit shift-up because it includes the flipping odd critical bits 612 located at 602-1 from register 640 E. The shift in second interleaved signal 662 LE is only 1 bit even if the shift has been 2 bits (S2=1) in first register 640 E because second interleaved signal 662 LE does not include the other two flipping bits located immediately above the flipping critical bits 612 from first register 640 E.

In the second half of the clock cycle t=t2=(T/2+d, T) when data bits in second register 642 L are loaded from first register 640 E, the two even bits immediately above the two odd critical bits 612 in second interleaved signal 662 LE will flip and cause an additional 1-bit shift-up in signal 662. Therefore, Phase_cntl[31:0]=LE[31:0], which rotates upward by 2 steps in one clock period with one bit shift per step.

FIG. 8 shows first and second registers 640 E and 642 L and first interleaved signal 660 EL during first and second time periods t1 and t2 when H=0, P=0 and D=1 (Sel=1). The odd critical bit 612 in first register 640 E shifts down by 1 or 2 bits at the beginning of the coming clock cycle. It is now the two even bits immediately below the critical bits 612 in register 640 E that make transitions in the first half clock cycle. They become the new critical bits 612 in first interleaved signal 660 EL, which includes only even bits from first register 640 E. The first interleaved signal 660 EL bits effectively shift down by 1 bit. For S2=1, the first interleaved signal 660 EL bits will shift down by one more bit when the two flipped odd bits in the first register 640 E are loaded to the second register 642 L in the second half of the clock period. Therefore, Phase_cntl[31:0]=EL[31:0], which rotates downward by 2 steps in one clock period with one bit shift per step.

In another example, when H=0, P=1 and D=0 (Sel=1), the even critical bits 612 in first register 640 E are going to shift up at the beginning of the coming clock cycle. Then even critical bits 612 make transitions, and the first interleaved signal 660 EL that include the even bits from the first register 640 E, are selected as the output, i.e., Phase_cntl [31:0]=EL [31:0].

In a further example, when H=0, P=1 and D=1 (Sel=0), the even critical bits 612 in first register 640 E shift down and the immediately lower odd bits transition. Therefore, the second interleaved signal 662 LE that includes the odd bits from first register 640 E are selected, i.e., Phase_cntl[31:0]=LE[31:0].

In a still further example, when H=1, first register 640 E and second register 642 L are forced to stay unchanged, and it does not matter which of first or second interleaved signals 660 EL or 662 LE is selected by selector 528 to be selected signal 546.

In one example, multiplexer 666 switches selection between first interleaved signal 660 EL and second interleaved signal 662 LE any time in the second half of the clock cycle, because E=L and hence EL=LE during this period of time. Multiplex switching in this time window avoids output glitches. For this purpose, delay buffers 664 are inserted between shifting device 624 and multiplexer 666 to make sure multiplexer 666 is ready to pass the right selection of first interleaved signal 660 EL or second interleaved signal 662 LE to the output before the rotated new first interleaved signal 660 EL and second interleaved signal 662 LE for the current clock cycle arrive at multiplexer 666. The delay should not exceed half clock period, otherwise multiplexer 666 may switch before the delayed first and second interleaved signals 660 EL and 662 LE finish the second rotation scheduled for the second half of the clock cycle.

It is to be appreciated that, although in some of the above exemplary operations of system 620 copying data from first register 640 to second register 642 is performed between the first and second half of the clock cycle, this may not be performed in other applications. In these other applications, data is not copied from first register 640 to second register 642 between the first and second half of the clock cycle, and the previous data in each of first and second registers 640 and 642 is shifted or rotated.

In one example, at power up of a device including system 520, first and second registers 640 E and 642 L and parity control bit P are reset as described above, hold control bit H is set to 1, and down and shift step control bits D and S2 are set to 0, thus Sel=(D xor P)=(0 xor 1) is set to 1.

It is to be appreciated that the above embodiments and examples of the present invention are applicable to any product or technology that uses a phase rotator. For example, some products are, but are not limited to, SERDES (serializer/deserialier) and SATA (Serial Advanced Technology Attachment) transceivers and clock recovery loops and clock generators. The above described technique can be used to double the phase rotation rate for a given clock frequency, which is important for high speed clock/data recovery.

Figure 9:
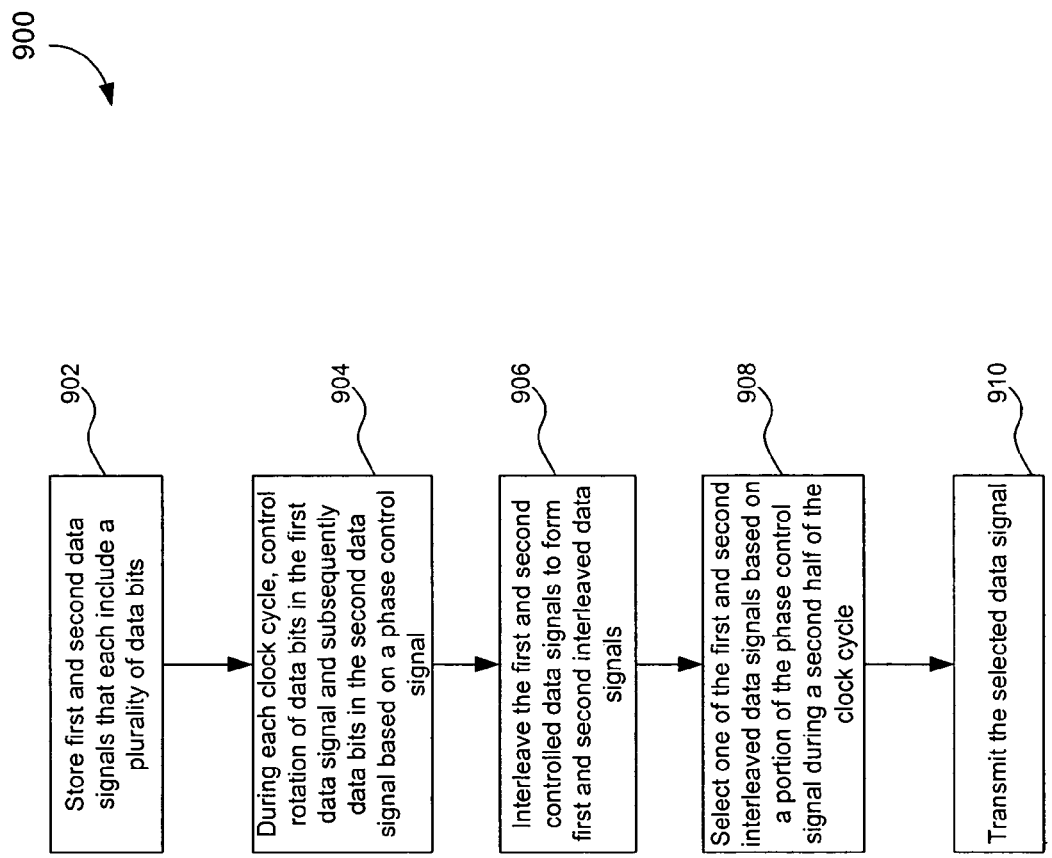
FIG. 9 is a flowchart depicting a method, according to one embodiment of the present invention.

FIG. 9 is a flowchart depicting a method 900, according to one embodiment of the present invention. In step 902, first and second data signals are stored, which each include a plurality of data bits. In step 904, during each clock cycle, rotation of data bits in the first data signal and subsequently data bits in the second data signal are controlled based on a phase control signal. In step 906, the first and second controlled data signals are interleaved to form first and second interleaved data signals. In step 908, one of the first and second interleaved data signals are selected based on a portion of the phase control signal during a second half of the clock cycle. In step 910, the selected data signal is transmitted.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged.

Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

What is claimed is:

1. A system for shifting bits multiple times per clock cycle, comprising:
   a controller that receives a phase input signal and a feedback signal, the feedback signal feeding back from an output of the controller, and that generates a first signal and a second signal;
   a multiple data bit per clock shifting device,
      that receives the first signal from the controller,
      that includes a first storage device with a first data signal and a second storage device with a second data signal, and
      that shifts data bits in the first and second data signals multiple times per clock cycle to produce a shifted signal based on the first signal from the controller;
   a selector controller that receives the second signal from the controller and generates a selector control signal during a first half of the clock cycle;
   a selector that receives the selector control signal from the selector controller during a second half of the clock cycle and the shifted signal from the shifting device and that generates a selected signal; and
   a clock that establishes the clock cycle through transmitting a clock signal to the controller, the first and second storage devices in the shifting device, and the selector controller.

2. The system of claim 1, wherein:
   the phase input signal is converted to a P, H, D, and S2 signals using the controller, wherein P relates to keeping track of a parity, H relates to whether to hold shifting, D relates to a direction of shifting, and S2 relates to a step size of shifting;
   the feedback signal comprises the P signal;
   the first signal comprises the P, H, D, and S2 signals; and
   the second signal comprises the P and D signals.

3. The system of claim 1, wherein the selector controller comprises:
   an exclusive OR gate that receives the second signal and determines an output signal, wherein the second signal includes a P signal and D signal, wherein P relates to keeping track of a parity and D relates to a direction of shifting; and
   a register that receives the output signal from the exclusive OR gate at its input and outputs the selector control signal during a subsequent clock cycle.

4. The system of claim 1, wherein the selector comprises:
   a delay device that receives the shifted signal from the shifting device and that generates a delayed signal; and
   a multiplexer that transmits a portion of the delayed signal based on the selector control signal from the selector controller.

5. The system of claim 1, wherein:
   the shifted signal comprises first and second interleaved signals interleaving data bits of the first and second data signals stored in the first and second storage devices, respectively.

6. The system of claim 5, wherein:
   the phase input signal is converted to P, H, D, and S2 signals using the controller, wherein P relates to keeping track of a parity, H relates to whether to hold shifting, D relates to a direction of shifting, and S2 relates to a step size of shifting; and
   the first signal comprises the P, H, D, and S2 signals that are used to control shifting of the data bits in the first and second data signals to control generation of the first and second interleaved signals.

7. The system of claim 5, wherein:
   the first interleaved signal includes odd-numbered ones of the data bits from the first storage device and even-numbered ones of the data bits from the second storage device; and
   the second interleaved signal includes odd-numbered ones of the data bits from the second storage device and even-numbered ones of the data bits from the first storage device.

8. The system of claim 5, wherein:
   the selector transmits one of the first and second interleaved signals based on the selector control signal from the selector controller.

9. The system of claim 1, wherein:
   the first and second storage devices are encoders; and
   the first and second data signals are 32-bit data signals.

10. The system of claim 1, wherein the shifting device further comprises:
    one or more additional storage devices that include one or more additional data signals.

11. The system of claim 1, wherein:
    during a first half of the clock cycle the shifting device shifts the data bits in the first data signal; and
    during a second half of the clock cycle the shifting device shifts the data bits in the second data signal.

12. The system of claim 11, wherein between the first and second halves of the clock cycle the data bits in the shifted first data signal are copied to become the second data signal.

13. The system of claim 1, wherein:
    the shifting device shifts data bits of the first and second data signal that at a data bit value transition location in the respective first and second storage devices.

* * * * *

UNITED STATES PATENT AND TRADEMARK OFFICE
CERTIFICATE OF CORRECTION

PATENT NO.         : 7,583,772 B2                                                        Page 1 of 1
APPLICATION NO.    : 11/240678
DATED              : September 1, 2009
INVENTOR(S)        : Pan et al.

It is certified that error appears in the above-identified patent and that said Letters Patent is hereby corrected as shown below:

Title page, item (60), Related U.S. Application Data section, please replace

"60/655,086, filed on Feb. 22, 2005." with --60/665,086, filed on March 25, 2005.--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,583,772 B2
APPLICATION NO. : 11/240678
DATED : September 1, 2009
INVENTOR(S) : Pan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 963 days.

Signed and Sealed this

Fourteenth Day of September, 2010

David J. Kappos
*Director of the United States Patent and Trademark Office*